United States Patent
Toyonaka et al.

(10) Patent No.: US 7,875,905 B2
(45) Date of Patent: Jan. 25, 2011

(54) SEMICONDUCTOR OPTICAL RECEIVER DEVICE, OPTICAL RECEIVER MODULE, AND METHOD FOR MANUFACTURING SEMICONDUCTOR OPTICAL RECEIVER DEVICE

(75) Inventors: Takashi Toyonaka, Yokohama (JP); Hiroyuki Kamiyama, Saitama (JP); Kazuhiro Komatsu, Yokohama (JP)

(73) Assignee: Opnext Japan, Inc., Kanagawa (JP)

( * ) Notice: Subject to any disclaimer, the term of this patent is extended or adjusted under 35 U.S.C. 154(b) by 142 days.

(21) Appl. No.: 12/081,385

(22) Filed: Apr. 15, 2008

(65) Prior Publication Data
US 2008/0265357 A1    Oct. 30, 2008

(30) Foreign Application Priority Data
Apr. 20, 2007   (JP)   .............................. 2007-111617

(51) Int. Cl.
*H01L 31/107* (2006.01)
(52) U.S. Cl. .................. 257/186; 257/199; 257/481; 257/603; 257/E31.063
(58) Field of Classification Search .................. 257/186, 257/103, 199, 481, 603, E31.063
See application file for complete search history.

(56) References Cited

U.S. PATENT DOCUMENTS
4,742,378 A * 5/1988 Ito et al. ................... 372/46.01

FOREIGN PATENT DOCUMENTS
| JP | 61-001064 | 1/1986 |
| JP | 2002-324911 | 11/2002 |
| JP | 2004-179404 | 6/2004 |

OTHER PUBLICATIONS
Japanese Office Action issued in Japanese Patent Application No. JP 2007-111617 dated Oct. 19, 2010.

* cited by examiner

*Primary Examiner*—Jerome Jackson, Jr.
*Assistant Examiner*—Dale Page
(74) *Attorney, Agent, or Firm*—McDermott Will & Emery LLP

(57) ABSTRACT

A semiconductor optical receiver device is provided, which a mesa comprising a plurality of semiconductor crystal layers formed on a semiconductor substrate including a pn junction having a first conductive semiconductor crystal layer and a second conductive semiconductor crystal layer and including a first contact layer on the semiconductor substrate, a plurality of electrodes to apply electric field to the pn junction are coupled on the semiconductor substrate, a second contact layer is formed on a buried layer in which the mesa is buried, and the electric field is applied to the pn junction through the first and second contact layers.

2 Claims, 2 Drawing Sheets

SEMICONDUCTOR OPTICAL RECEIVER DEVICE, OPTICAL RECEIVER MODULE, AND METHOD FOR MANUFACTURING SEMICONDUCTOR OPTICAL RECEIVER DEVICE

CLAIM OF PRIORITY

The present application claims priority from Japanese patent application serial no. 2007-111617, filed on Apr. 20, 2007, the content of which is hereby incorporated by reference into this application.

BACKGROUND OF THE INVENTION

The invention relates to a semiconductor optical receiver device, a optical receiver module and a method for manufacturing semiconductor optical receiver device, specifically, pertaining to the semiconductor optical receiver device that is particularly provided with a buried mesa-structure and whose response speed improves, the optical receiver module and the method of producing such semiconductor optical receiver device.

The production steps of a backside-illuminated type Avalanche Photo Diode (APD) are disclosed in FIGS. 1 through 9 of Japanese Patent Application Laid-open No. 2004-179404. In turn, in FIGS. 11 through 18, the production steps of a surface-illuminated type APD are disclosed. To note, the surface-illuminated type APD shown in FIG. 18 adopts a p-type ring electrode while a contact portion (through hole) with the p-type electrode of the backside-illuminated type APD shown in FIG. 9 is not of ring shape. However, even with such backside-illuminated type APD as mentioned above, nowadays, it is general to form the through hole of the passivation layer in contact with the p-type electrode into an annular shape and form a mirror inside the through hole, which mirror is formed by the passivation layer inside the through hole in contact with the metallized electrode, so that light reflected from the mirror can be reabsorbed.

Further, a basic technology of APD provided with a field control layer is disclosed in Japanese Patent Application Laid-open No. 2002-324911.

According to either the backside-illuminated type APD or the surface-illuminated type APD disclosed in the above prior arts, the outer diameter of the mirror or the diameter of the light receiving portion thereof is smaller than the diameter of the inner first mesa. On the other hand, it is necessary to reduce parasitic capacitance in order to improve on the response speed of the APD. In order to reduce the parasitic capacitance, it is required to reduce the diameter of the first mesa. However, the reduction of the outer diameter of the backside-illuminated type APD mirror or the diameter of the light receiving portion of the surface-illuminated type APD causes the light receiving sensitivity of the photodiode or the optical coupling tolerance with optical fibers to deteriorate.

SUMMARY OF THE INVENTION

The present invention is to reduce the parasitic capacitance without deteriorating the light receiving sensitivity of the photodiode and reducing the diameter of the light receiving portion thereof.

This object is achieved by a semiconductor optical receiver device in which a mesa comprising a plurality of semiconductor crystal layers formed on a semiconductor substrate including a pn junction having a first conductive semiconductor crystal layer and a second conductive semiconductor crystal layer and including a first contact layer on the semiconductor substrate, and a plurality of electrodes to apply electric field to the pn junction are coupled on the semiconductor substrate, wherein a second contact layer is formed on a buried layer in which the mesa is buried and the electric field is applied to the pn junction through the first and second contact layers.

This object is also achieved by a semiconductor optical receiver device wherein a mesa comprising a plurality of semiconductor crystal layers formed on a semiconductor substrate including a pn junction having a first conductive semiconductor crystal layer and a second conductive semiconductor crystal layer is formed and an electrode disposed with regard to the mesa and an electrode disposed with respect to the semiconductor substrate to apply electric field to the pn junction are coupled on the semiconductor substrate, a contact portion of the electrode disposed with regard to the mesa has an annular shape, and an inner diameter of the mesa being larger than or equal to an outer diameter of the mesa.

This object is further achieved by a method for manufacturing a semiconductor optical receiver device, the method including the steps of: forming a mesa comprising a plurality of semiconductor crystal layers formed on a semiconductor substrate including a pn junction having a first conductive semiconductor crystal layer and a second conductive semiconductor crystal layer, and including a first contact layer on the semiconductor substrate; forming a buried layer in which the mesa is buried; forming a second contact layer coupled to the first contact layer on the buried layer; and forming an electrode layer coupled to the second contact layer.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

Figure 1:
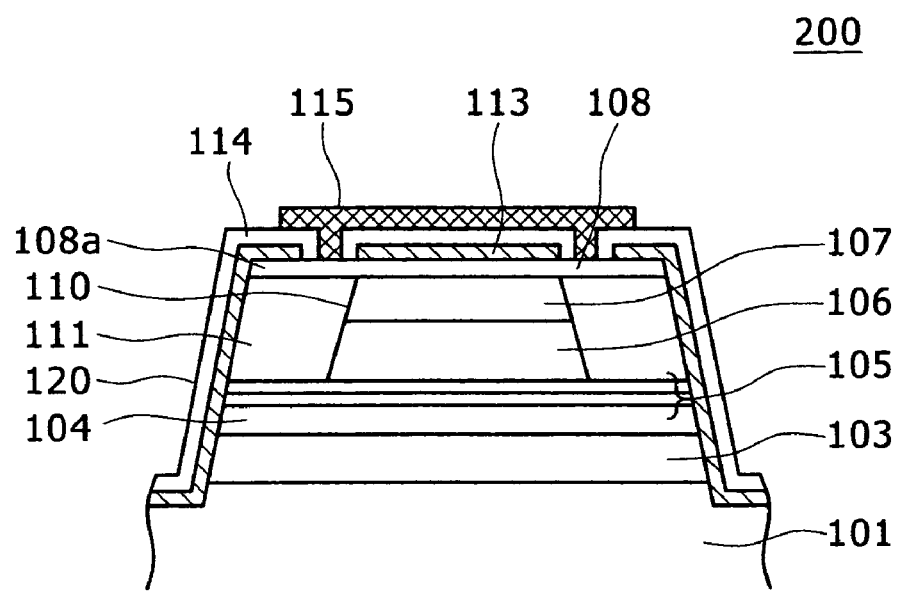
FIG. 1 is a sectional view of the periphery of the second mesa of the backside-illuminated type APD.

Hereinafter, the modes for carrying out the invention are exemplified in the following preferred embodiments with reference to the accompanying drawings, in which the same reference numerals indicate the identical parts, the same explanation for which is omitted to avoid redundancy.

First Embodiment

The present embodiment is explained with reference to FIGS. 1 and 2 respectively showing a sectional view of the periphery of the second mesa of the backside-illuminated type APD and a block diagram of the optical receiver module according to the invention.

With reference to FIG. 1, the structure and production steps of the backside-illuminated type APD are explained. To note, FIGS. 1 and 3 (described later) show the sectional view of the principal parts of the finished APD, with reference to which the person in the art could understand the productions steps thereof.

As shown in FIG. 1, on an n-type InP substrate 101 whose impurity concentration amounts to $1\times10^{18}/cm^3$, such layers are formed by means of Molecular Beam Epitaxy (MBE) as an n-type InAlAs buffer layer 103 whose impurity concentration amounts to $2\times10^{18}/cm^3$ and whose thickness amounts to 0.7 μm, an n-type InAlAs multiplication layer 104 whose impurity concentration amounts to $5\times10^{14}/cm^3$ and whose thickness amounts to 0.2 μm, a p-type InAlAs/p-type InGaAs/p-type InAlAs field control layer 105 whose impurity concentration amounts to $1\times10^{18}/cm^3$ and whose respective thickness amounts to 0.02 μm, a p-type InGaAs absorption layer 106 whose impurity concentration amounts to $1\times10^{15}/cm^3$ and whose thickness amounts to 1.2 μm, a p-type InAlGaAs cap layer 107 whose impurity concentration amounts to $5\times10^{17}/cm^3$ and whose thickness amounts to 1.0 μm and a p-type InGaAs contact layer 108 whose impurity concentration amounts to $5\times10^{19}/cm^3$ and whose thickness amounts to 0.1 μm.

After the formation of a circular hard mask, the contact layer 108, the cap layer 107, the absorption layer 106 and the field control layer 105 are etched with a phosphoric acid based etching liquid. The etching operation comes to a halt in the middle of the field control layer 105 in order to prevent a pn junction (or an interface between the field control layer 105 and the multiplication layer 104 below the same) from being exposed. With the production steps up to here completed, a first mesa 110 is formed on the substrate 101.

Then, by means of Metal Organic Vaporphase Epitaxy (MOVPE), a buried layer 111 whose impurity concentration amounts to $1\times10^{15}/cm^3$ and whose thickness amounts to 1.6 μm and that is made from a p-type InP crystal, is grown on the substrate 101 on the periphery of the first mesa 110. A p-type InGaAs contact layer 108a whose impurity concentration amounts to $5\times10^{19}/cm^3$ and whose thickness amounts to 0.1 μm is formed again on the buried layer 111 with the hard mask removed, which contact layer 108a is integrally coupled to the contact layer 108.

Subsequently, a photo-resist having a circular planar pattern whose diameter is larger than that of the first mesa 110 is formed on the contact layer 108a, with which photo-resist acted as a mask the contact layer 108a, the buried layer 111, the field control layer 105, the multiplication layer 104, the buffer layer 103 and the substrate 101 surface are etched with a Br based etching liquid.

With the production steps up to here completed, a second mesa 120 is formed on the substrate 101 on the periphery of the first mesa 110. The second mesa 120 has a concentric planar pattern with regard to the first mesa 110.

With the photo-resist removed, the whole surface of the substrate 101 is coated with an insulating protective film, which film is formed by depositing a SiN film 113 whose thickness amounts to 0.2 μm and a $SiO_2$ film 114 whose thickness amounts to 0.3 μm thereon.

After a part (through hole) of the contact layer 108a and an unshown part of the substrate 101 are exposed with the protective film subjected to the photolithographic process, a p-type electrode 115 to be coupled to the contact layer 108a and an unshown n-type electrode to be coupled to the substrate 101 are formed. The electrodes are formed by patterning with the photolithographic process a Ti/Pt/Au film that is deposited on the substrate by evaporation method and whose thickness amounts to 0.5 μm, which film components are slashed in between them hereby to indicate the component on the left side slash is nearest to the substrate and that on the right side slash is farthest therefrom. To note, the through hole formed on the contact layer 108a has a ring shape comprising two concentric circles. It is arranged hereby that the diameter of the first mesa 110 is equal to or smaller than that of the inner concentric circle. As a result of it, looking inside the inner concentric circle, a mirror is made up of with the transparent protective films 113 and 114 as well as the Ti/Pt/Au metallized film formed on the contact layer 108.

The backside-illuminated type APD 200 as shown in FIG. 1 is arranged such that the light entered from the backside surface thereof is reflected by the mirror and passed bi-directionally through the absorption layer 106 so as to generate carrier, and the multiplication layer is provided to multiply carrier as well as parasitic capacitance is reduced by making the diameter of the first mesa smaller, so that it is provided with higher light receiving sensitivity and excellent in response speed.

Figure 2:
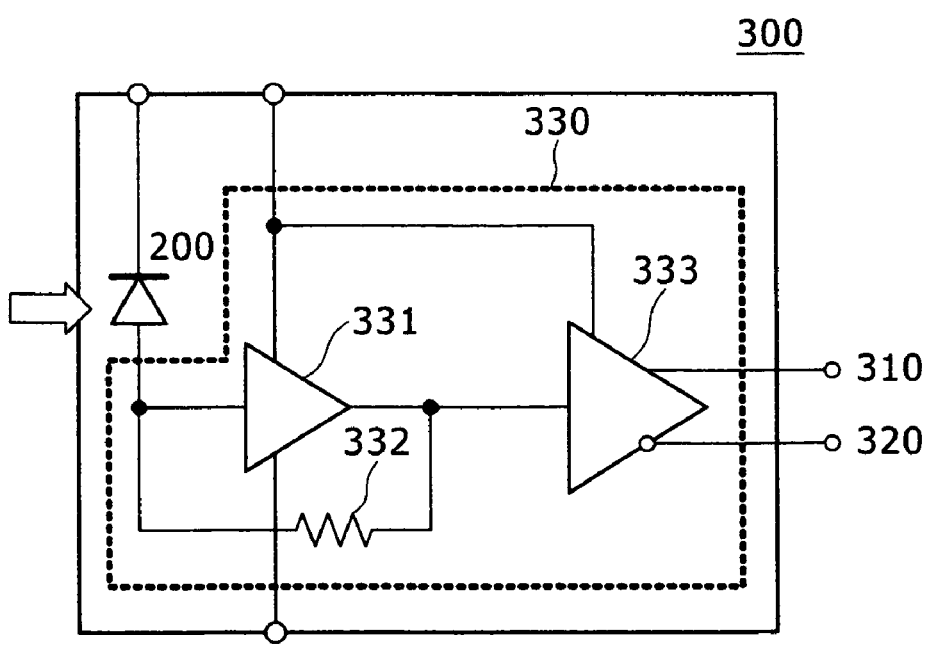
FIG. 2 is a block diagram of the optical receiver module.

The optical receiver module 300 as shown in FIG. 2 comprises a backside-illuminated type APD 200 and a Trans Impedance Amplifier (TIA) 330 provided with a limit amplifier 333. Besides the limit amplifier 333, this TIA 330 comprises a pre-amplifier 331 and a feedback resistance 332, which TIA 330 is a negative feedback amplifier to convert input current into output voltage. The optical receiver module 300 is arranged such that it receives light signals as shown in the drawing with an arrow at the backside-illuminated type APD 200 and those signals are output as electrical signals from an OUT 1 terminal 310 that is a positive-phase terminal of the TIA 330 and from an OUT 2 terminal 320 that is a negative-phase terminal thereof.

As the light receiving portion of the backside-illuminated type APD 200 incorporated in the optical receiver module 300 is comparatively larger in diameter, it enables the latter to be combined with a pre-amplifier of smaller capacitance and lower input impedance, which enhances high-frequency response speed. Further, the module 300 facilitates optical axis alignment and results in lower production cost and higher yield especially in such high-speed optical communication field as 2.5 Gbits/s or more.

According to the above embodiment, the through hole in contact with the metallized electrode is formed outside the first mesa, so that the smallest diameter of the first mesa can be achieved that meets the requirements for the light receiving sensitivity and the diameter of the light receiving portion of the APD, with the result that parasitic capacitance reduces so as to enhance response speed. The mirror covers the whole upper space over the first mesa, so that the planar distribution of the light receiving sensitivity becomes uniform so as to facilitate the coupling with the optical fibers.

Second Embodiment

Figure 3:
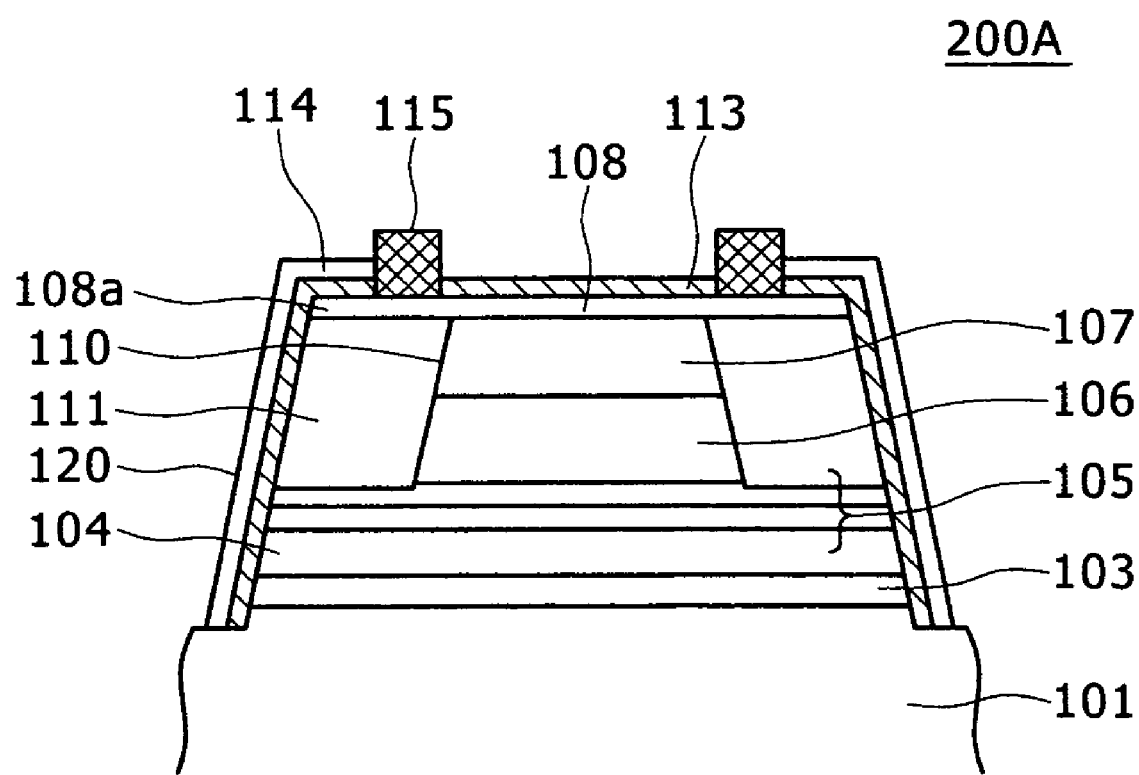
FIG. 3 is a sectional view of the periphery of the second mesa of the surface-illuminated type APD.

With reference to FIG. 3, the present embodiment is explained below. FIG. 3 shows a sectional view of the periphery of the second mesa of the surface-illuminated type APD. In conjunction with FIG. 3, the structure and production steps of the surface-illuminated type APD are explained.

As shown in FIG. 3, on an n-type InP substrate 101 whose impurity concentration amounts to $1\times10^{18}/cm^3$, such layers are formed by means of MBE as an n-type InAlAs buffer layer 103 whose impurity concentration amounts to $2\times10^{18}/cm^3$ and whose thickness amounts to 0.7 μm, an n-type InAlAs multiplication layer 104 whose impurity concentration amounts to $5\times10^{14}/cm^3$ and whose thickness amounts to 0.2 μm, a p-type InAlAs/p-type InGaAs/p-type InAlAs field control layer 105 whose impurity concentration amounts to $1\times10^{18}/cm^3$ and whose respective thickness amounts to 0.02 μm, a p-type InGaAs absorption layer 106 whose impurity concentration amounts to $1\times10^{15}/cm^3$ and whose thickness amounts to 1.4 μm, a p-type InAlGaAs cap layer 107 whose impurity concentration amounts to $5\times10^{17}/cm^3$ and whose thickness amounts to 1.0 μm and a p-type InGaAs contact layer 108 whose impurity concentration amounts to $5\times10^{19}/cm^3$ and whose thickness amounts to 0.1 μm.

After the formation of a circular hard mask, the contact layer 108, the cap layer 107, the absorption layer 106 and the field control layer 105 are etched with a phosphoric acid based etching liquid. The etching operation comes to a halt in the middle of the field control layer 105 in order to prevent a pn junction from being exposed. With the production steps up to here completed, a first mesa 110 is formed on the substrate 101.

Then, by means of Metal Organic Vaporphase Epitaxy, a buried layer 111 whose impurity concentration amounts to $1\times10^{15}/cm^3$ and whose thickness amounts to 1.6 μm and that is made from a p-type InP crystal, is grown on the substrate 101 on the periphery of the first mesa 110. A p-type InGaAs contact layer 108a whose impurity concentration amounts to $5 \times 10^{19}/cm^3$ and whose thickness amounts to 0.1 μm is formed again on the buried layer 111 with the hard mask removed, which contact layer 108a is integrally coupled to the contact layer 108. To note, the thickness of the absorption layer 106 according to the first embodiment amounts to 1.2 μm while that amounts to 1.4 μm according to the present embodiment. On the other hand, the thickness of the buried layer 111 according to the present embodiment is the same as that of the first embodiment or 1.6 μm. Optimization is must for the thickness of the buried layer 111, as the lateral side surfaces of the first mesa 110 are not buried to the top ends by the same if it is too thin while it protrusively heaps up if it is too thick. The inventors and the concerned experimentally do not find that applying the same thickness of the buried layer 111 as the first embodiment to the present embodiment causes any problem.

Subsequently, a photo-resist having a circular planar pattern whose diameter is larger than that of the first mesa 110 is formed on the contact layer 108, with which photo-resist acting as a mask the contact layer 108a, the buried layer 111, the field control layer 105, the multiplication layer 104, the buffer layer 103 and the substrate 101 surface are etched with a Br based etching liquid.

With the production steps up to here completed, a second mesa 120 is formed on the substrate 101 on the periphery of the first mesa 110. The second mesa 120 has a concentric planar pattern with regard to the first mesa 110.

With the photo-resist removed, the whole surface of the substrate 101 is coated with an insulating protective film, which film is formed by depositing a SiN film 113 whose thickness amounts to 0.2 μm and a $SiO_2$ film 114 whose thickness amounts to 0.3 μm thereon.

After a part (through hole) of the contact layer 108a and an unshown part of the substrate 101 are exposed with the protective film subjected to the photolithographic process. To note, the through hole formed on the contact layer 108a has a ring shape comprising two concentric circles. It is arranged hereby that the diameter of the first mesa 110 is equal to or smaller than that of the inner concentric circle. The $SiO_2$ film 114 coated on the inside of the through hole formed on the contact layer 108a is etched again with the photolithographic process. As a result of it, the SiN film 113 remained on the inside of the through hole acts as an anti-reflective film.

Subsequently, a p-type electrode 115 to be coupled to the contact layer 108a and an unshown n-type electrode to be coupled to the substrate 101 are formed, which electrodes are formed by patterning a Ti/Pt/Au film that is deposited on the substrate by evaporation method and whose thickness amounts to 0.5 μm with the photolithographic process. To note, the p-type electrode 115 has a ring shape, the inside of which corresponds to a light receiving portion. FIG. 3 shows only a sectional view of the electrode.

The surface-illuminated type APD 200A as shown in FIG. 3 is arranged such that the light entered from the surface is unidirectionally passed through the absorption layer 106 that is thicker than that of the first embodiment so as to generate carrier and the multiplication layer is provided to multiply carrier as well as parasitic capacitance is reduced, so that it enhances light receiving sensitivity and response speed.

With the surface-illuminated type APD 200A as shown in FIG. 3 incorporated in the optical receiver module 300 as shown in FIG. 2, it enables the latter to be combined with a pre-amplifier of smaller capacitance and lower input impedance, which enhances high-frequency response speed. Further, the module 300 facilitates optical axis alignment and results in lower production cost and higher yield especially in such high-speed optical communication field as 2.5 Gbits/s or more.

According to the above embodiment, a ring-like electrode is formed outside the first mesa, so that the smallest diameter of the first mesa can be achieved that meets the requirements for the diameter of the light receiving portion of the APD, with the result that parasitic capacitance reduces so as to enhance response speed.

According to the invention, it enables parasitic capacitance to reduce without deteriorating the light receiving sensitivity of the APD and reducing the diameter of the receiving portion thereof.

What is claimed is:

1. A semiconductor optical receiver device comprising:
   a semiconductor substrate;
   a mesa formed on the semiconductor substrate, including a plurality of semiconductor crystal layers, the plurality of semiconductor crystal layers including a pn junction having a first conductive layer and a second conductive layer; and
   a first electrode disposed with regard to the mesa and a second electrode disposed with regard to the semiconductor substrate, the first and second electrodes configured to apply an electric field to the pn junction, wherein:
   a contact portion of the first electrode disposed with regard to the mesa has an annular shape,
   an inner diameter of the first electrode disposed with regard to the mesa is larger than or equal to a diameter of the mesa, and
   the first electrode disposed with regard to the mesa has an annular shape, and in an inner side of the first electrode disposed with regard to the mesa, an anti-reflective portion is provided to transmit light entered from a surface of the device.

2. A semiconductor optical receiver device comprising:
   a semiconductor substrate;
   a mesa formed on the semiconductor substrate, including a plurality of semiconductor crystal layers, the plurality of semiconductor crystal layers including a pn junction having a first conductive layer and a second conductive layer;
   a first electrode disposed with regard to the mesa and a second electrode disposed with regard to the semiconductor substrate, the first and second electrodes configured to apply an electric field to the pn junction; and
   a transparent protective film formed between the mesa and the first electrode disposed with regard to the mesa, wherein:
   a contact portion of the first electrode disposed with regard to the mesa has an annular shape,
   an inner diameter of the first electrode disposed with regard to the mesa is larger than or equal to a diameter of the mesa, and
   the first electrode disposed with regard to the mesa reflects light entered from a backside of the device by a mirror being made up of the transparent protective film and the first electrode disposed with regard to the mesa.

* * * * *